United States Patent [19]

Higashida

[11] Patent Number: 5,726,472
[45] Date of Patent: Mar. 10, 1998

[54] SEMICONDUCTOR DEVICE

[75] Inventor: Syouji Higashida, Kyoto, Japan

[73] Assignee: Rohm Co., Ltd., Kyoto, Japan

[21] Appl. No.: 622,065

[22] Filed: Mar. 26, 1996

[30] Foreign Application Priority Data

Mar. 31, 1995 [JP] Japan .................. 7-075316

[51] Int. Cl.$^6$ .................................. H01L 29/76
[52] U.S. Cl. .................................. 257/341; 257/488
[58] Field of Search .................. 257/341, 488, 257/659, 786

[56] References Cited

U.S. PATENT DOCUMENTS 4,881,106 11/1989 Barron .................. 257/659

FOREIGN PATENT DOCUMENTS 63-73564 4/1988 Japan .................. 257/341
5167070 7/1993 Japan .

*Primary Examiner*—Mark V. Prenty
*Attorney, Agent, or Firm*—Brumbaugh, Graves, Donohue & Raymond

[57] ABSTRACT

A semiconductor device having a power MOSFET. The power MOSFET has a plurality of FET cells formed over a semiconductor substrate, has gate electrodes of the respective FET cells connected to one another, and has a gate electrode pad, for connection to an external terminal, formed over the semiconductor substrate through an insulating film. The gate electrode pad is arranged so as to extend over the FET cells through an insulating film.

4 Claims, 2 Drawing Sheets

SEMICONDUCTOR DEVICE

BACKGROUND OF THE INVENTION

1. Field of the Invention

The invention relates to a semiconductor device having a power MOSFET. More specifically, the invention is directed to a semiconductor device having a power MOSFET in which the structure of the gate electrode pad portion is improved and in which cells are hard to break during switching operation.

2. Description of the Related Art

As shown in a schematic plan view and a partially sectional view of FIGS. 2 and 3, a power MOSFET has a plurality of FET cells 10 arranged in a matrix fashion, each FET cell 10 consisting of a source region 3 and a channel portion 2a on a surface of a semiconductor substrate 1. In order to connect mutually source electrodes 8 and gate electrodes 5 of the respective FET cells 10, a source electrode pad 8a and a gate electrode pad 7 are formed on each chip. Reference numeral 7a designates an aluminum wiring arranged around the outer periphery of each chip so as to be connected to the gate electrode pad 7. The aluminum wiring 7a is designed to decrease the accumulated resistance of the gate electrodes 5 made of polysilicon even when the aluminum wiring 7a is arranged remote from the gate electrode pad 7. Reference numerals 21 and 22 designate wires to be bonded to the gate electrode pad 7 and to the source electrode pad 8a, respectively. Further, this is a so-called vertical MOSFET in which a drain electrode is arranged on the bottom surface of the semiconductor substrate 1 and in which a current flows from the top to the bottom surface. The drain current is obtained as the sum of currents in the respective cells.

FIG. 3 is a partially sectional view illustrative of the gate electrode pad 7 and the FET cells 10. The semiconductor substrate 1 includes an $n^-$-type epitaxial layer 1b epitaxially grown on an $n^+$-type substrate 1a, for example. The semiconductor substrate 1 has a p-type region 2 formed for forming the channel of each FET cell 10, and has source regions 3 formed within each p-type region 2. The channel portions 2a are formed at the ends of each p-type region 2. A gate oxide film 4 is formed over the channel portions 2a. A gate electrode 5 made of, e.g., polysilicon is formed on the gate oxide film 4. The gate electrodes 5 of the respective FET cells 10 are connected to a polysilicon film 5a at a portion where the gate electrode pad 7 is arranged. The polysilicon film 5a is arranged also on a field oxide film 4a that is formed simultaneously with the gate oxide film 4 on the semiconductor substrate 1 where no FET cells 10 are formed. A source electrode 8 is arranged through an interconnection layer insulating film 6 so as to be connected to the source region 3 of the respective FET cells 10 and so as to connect the source regions 3 of the respective FET cells 10 to one another. The interconnection layer insulating film 6 serves to electrically insulate the source electrodes 8 from the gate electrodes 5. The gate electrode pad 7 is arranged also on the polysilicon film 5a simultaneously with the formation of the source electrodes 8. Before the oxide films and the like are arranged on the top surface of the semiconductor substrate 1, a p well 9 is arranged on a top portion of the semiconductor substrate 1 where the gate electrode pad 7 is arranged, so that a depletion layer in the $n^-$-type epitaxial layer 1b that acts as the drain under the gate electrode pad 7 when a reverse-bias voltage is applied between the drain and source can extend stably to thereby improve the withstanding voltage.

As described above, the conventional power MOSFET has the source electrodes 8 and the gate electrode pad 7 thereof formed of the same metallic film at the same time. Therefore, the gate electrode pad 7 is arranged in the region where there are no FET cells 10, and the p well 9 is arranged in the semiconductor substrate under the gate electrode pad 7 so that the depletion layer can extend stably.

However, the p well 9 has a width L of about several hundreds μm, which is quite large compared with a width M of 15 to 30 μm of a single FET cell 10. Therefore, the amount of holes stored in the p well 9 is also large. As a result, when the MOSFET is operated to be switched to the off state, i.e., when a parasitic diode formed at a portion at which the p well is connected to the $n^-$-type epitaxial layer is reverse-recovered, a commutation $dV_{DS}/dt$ is generated, causing the holes stored in the p well 9 formed under the gate electrode pad to enter the adjacent cells. This in turn allows an $n^-$-p-$n^+$ junction parasitic bipolar transistor to turn on, imposing the problem that the FET cell closest to the p well 9 is broken by reverse current concentrating on such FET cell and that this fact makes the MOSFET defective.

On the other hand, Japanese Patent Unexamined Publication No. Hei. 5-167070 discloses a semiconductor device in which the p well is gotten rid of or in which the area of the p well is reduced. However, if the p well is gotten rid of or if the area of the p well is reduced, the depletion layer in the $n^-$-type semiconductor layer on the lower side of the gate electrode pad is not formed stably, imposing the problem that the withstanding voltage of the MOSFET is low.

SUMMARY OF THE INVENTION

The invention has been made in view of the aforementioned circumstances, and has an object to provide a semiconductor device having a power MOSFET in which FET cells are not broken by commutation during the switching operation of the power MOSFET and in which the power MOSFET has a high withstanding voltage.

To achieve the above object, the invention provides a semiconductor device having a power MOSFET comprising: a semiconductor substrate; a plurality of FET cells formed on the semiconductor substrate; and a gate electrode pad, to which gate electrodes of the FET cells are connected, for connection to an external terminal, the gate electrode pad being formed on the semiconductor substrate through an insulating film so as to extend over the FET cells.

DETAILED DESCRIPTION OF THE PREFERRED EMBODIMENT

A semiconductor device of the invention will now be described with reference to the drawings.

Figure 1:
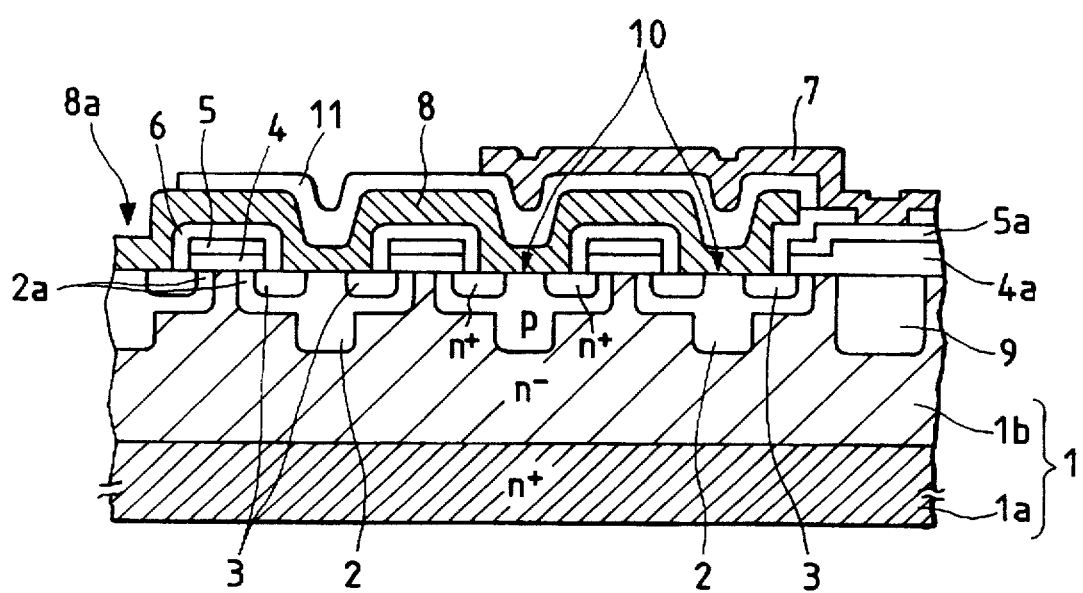
FIG. 1 is a sectional view illustrative of a semiconductor device, which is an embodiment of the invention.
Figure 2:
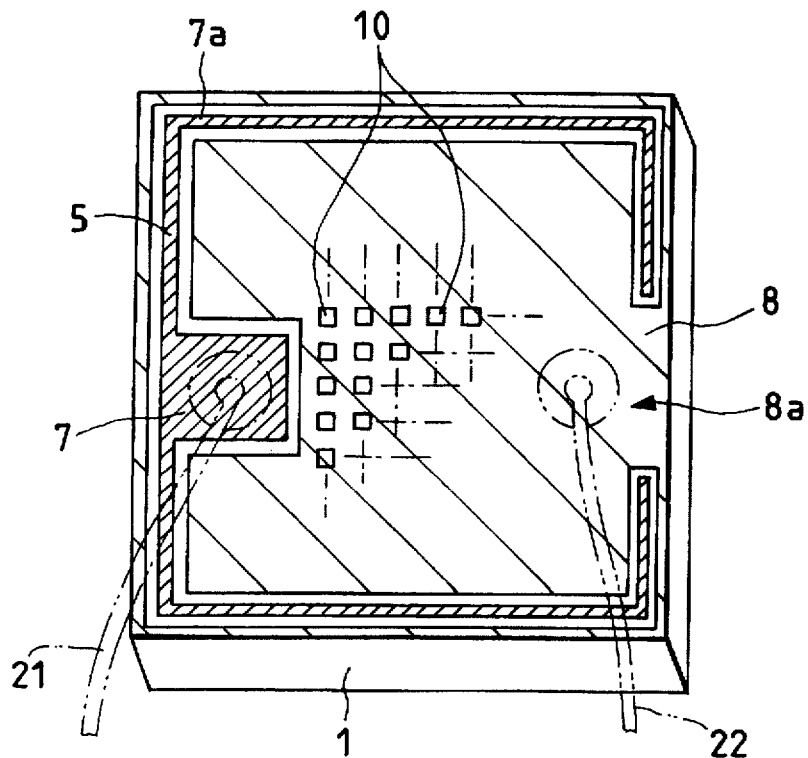
FIG. 2 is a schematic view illustrative of a conventional semiconductor device having a power MOSFET.

FIG. 1 is a sectional view illustrative of a semiconductor device, which is an embodiment of the invention. A gate electrode pad portion of a power MOSFET is illustrated.

Figure 3:
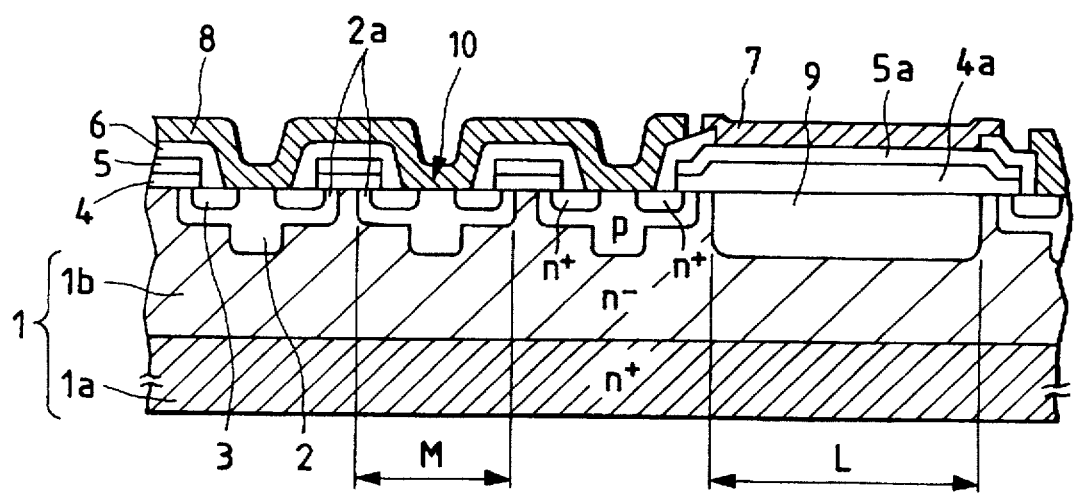
FIG. 3 is a sectional view illustrative of the conventional semiconductor device.

In FIG. 1, reference numerals 1 to 10 designate the same parts and components as those in FIG. 3, and reference numeral 11 designates an insulating film formed over a source electrode 8 excluding the portion of a source electrode pad 8a. In this structure a semiconductor substrate 1 acts as the drain, and a not shown drain electrode is arranged on the bottom surface of the semiconductor substrate 1. The invention is characterized in that a gate electrode pad 7 is arranged so as to extend over the source electrodes 8 on which the FET cells 10 are arranged through the insulating film 11. This design allows the area where no FET cells 10 are arranged, i.e., the area of a p well 9 to be reduced to thereby reserve the area necessary as a wire bonding pad.

A portion to connect a polysilicon film 5a to the gate electrode pad 7 must be provided, the polysilicon film 5a connecting the gate electrodes 5 of the respective FET cells 10. Therefore, the polysilicon film 5a is arranged at a portion adjacent to each FET cell 10 so as to be connected to the corresponding gate electrode 5 of the FET cell 10. In the invention the area of the portion where the polysilicon film 5a is arranged is reduced; the area of the p well 9 to be arranged in the semiconductor substrate 1 is reduced to a half of the area necessary as the gate electrode pad 7 or less, or more preferably, e.g., to values equal to or smaller than about 15 to 30 μm², which is the area of a FET cell 10. In other words, if the area of the p well 9 is reduced to a half of the area necessary for the gate electrode pad 7 or less, the amount of current carriers introduced into the adjacent FET cells during switching operation is also reduced to a half or less, thereby preventing the FET cells from being broken due to commutation. By further reducing the area of the p well 9, not only the possibility of breakage can be reduced further, but also improved circuit characteristics owing to an increased number of FET cells and the downsizing of a chip can be achieved as will be described later. On the other hand, the gate electrode pad 7 requires at least an area of several hundreds μm² for wire bonding. In order to reserve such an area, the gate electrode pad 7 in the invention is arranged so as to extend over the source electrodes 8 of the adjacent FET cells 10 through the insulating film 11.

Even if the p well 9 is arranged in the semiconductor substrate 1 under the gate electrode pad 7, the volume of the thus constructed semiconductor device of the invention is small, and the capacitance of the parasitic diode is also small. As a result, when the MOSFET is operated for switching, the current concentrates less in the FET cells while the MOSFET is being turned off, thereby improving withstanding voltage against $dV_{DS}/dt$. On the other hand, the presence of the p well 9 adjacent to the FET cell 10 extends the depletion layer of the p-n junction between the p-type region 2 of the FET cell 10 and the n⁻-type epitaxial layer 1b so as not to reach the top surface of the semiconductor substrate. As a result, withstanding voltage is improved as well.

Further, as a result of the aforementioned construction, the area where no FET cells are arranged under the gate electrode pad is reduced, to allow the number of FET cells to be increased. This further contributes to increasing current, improving various circuit characteristics with the conventional chip size unchanged. On the other hand, if it is not required to increase the number of cells, the chip can be downsized accordingly.

A method of fabricating the semiconductor device of the invention will be described next.

First, for example, an n⁻-type semiconductor layer is epitaxially grown on the n⁺-type substrate 1a to a thickness of about 10 to 60 μm as the epitaxial layer 1b to thereby form a semiconductor substrate 1 by both the substrate 1a and the epitaxial layer 1b. This semiconductor substrate 1 acts as the drain.

Then, in order to form both the p-type regions 2 for forming the channels of the respective FET cells 10 and the p well 9 in the area where no FET cells are arranged under the gate electrode pad 7, p-type impurities such as boron are diffused in the form of islands. Then, n-type impurities such as phosphorus or arsenic are diffused in such a manner that a certain gap is given from the peripheral ends within each p-type region 2 to thereby form the source regions 3. It may be noted that the gap between the source region 3 and the peripheral end of the p-type region 2 becomes the channel portion 2a.

Then, the gate oxide film 4 and the gate electrode 5 are formed on the top surface of the semiconductor substrate 1 so as to cover the channel portions 2a. The gate oxide film 4 and the gate electrode 5 are patterned, e.g., by first oxidizing the top surface of the semiconductor substrate 1 and then depositing polysilicon containing n-type impurities by means of a chemical vapor deposition (CVD) technique. During this process the field oxide film 4a and the polysilicon film 5a are left formed also on the region where no FET cells are arranged. The polysilicon film 5a is patterned so as to be connected to the gate electrode 5 of each FET cell 10.

Then, the interconnection layer insulating film 6 is formed by forming a silicon nitride film and the like on the gate electrodes 5 by means of a CVD technique in such a manner that the top surface of the source region 3 can be exposed, and the source electrode 8 is formed by arranging, e.g., an aluminum film by a deposition process such as sputtering or the like. It may be noted that no aluminum films are formed on the polysilicon film 5a on the region where no FET cells are arranged.

Then, the insulating film 11 such as a silicon nitride film is formed over the source electrodes 8 by means of a CVD technique or the like, and the insulating film is removed only at a region where the gate electrode pad 7 is arranged and a region where the source electrode pad 8a is formed. The gate electrode pad 7 is thereafter formed by depositing aluminum or the like so as to extend over the insulating film 11 on the FET cells 10.

The above method requires that the source electrodes 8 and the gate electrode pad 7 be formed in two separate processes. However, since the gate electrode pad 7 can be formed on the FET cells 10, the area of the potion of the polysilicon film 5a can be reduced, allowing the area of the p well 9 to be reduced as well.

The invention is characterized as forming the gate electrode pad so as to extend over the FET cells through the insulating film. Therefore, the size of the well under the gate electrode pad can be reduced, excluding the possibility of breaking the adjacent FET cell during the switching operation of the MOSFET and therefore allowing a high-reliability semiconductor device to be provided.

Further, the invention is characterized as allowing the well to be formed in a region where no FET cells are formed under the gate electrode pad. Therefore, the depletion layer between the p-n junction of each FET cell can extend stably, maintaining the withstanding voltage of the MOSFET at a sufficiently high level.

Still further, the invention is characterized as allowing the region where no FET cells are arranged under the gate electrode pad to be reduced. Therefore, the number of FET cells can be increased, contributing to improving the characteristics of the semiconductor device and to reducing the area of a chip.

What is claimed is:

1. A semiconductor device having a power MOSFET comprising:

a semiconductor substrate;

a plurality of FET cells formed on said semiconductor substrate; and a gate electrode pad, to which gate electrodes of said FET cells are connected, for connection to an external terminal, said gate electrode pad being formed on said semiconductor substrate through an insulating film so as to extend over said FET cells.

2. The semiconductor device according to claim 1, wherein a well whose electrically conducting type is different from that of said semiconductor substrate is formed in a region of said semiconductor substrate under said gate electrode pad where no FET cells are arranged.

3. The semiconductor device according to claim 2, wherein an area of the region under said gate electrode pad where no FET cells are arranged is reduced so that an area of the well is set to a half of an area of said gate electrode pad or less.

4. The semiconductor device according to claim 1, wherein the extended portion of said gate electrode pad is formed over source electrodes to be connected to source regions of said FET cells through the insulating film.

* * * * *